US006351490B1

(12) United States Patent
Serizawa

(10) Patent No.: US 6,351,490 B1
(45) Date of Patent: Feb. 26, 2002

(54) VOICE CODING APPARATUS, VOICE DECODING APPARATUS, AND VOICE CODING AND DECODING SYSTEM

(75) Inventor: Masahiro Serizawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/229,301

(22) Filed: Jan. 13, 1999

(30) Foreign Application Priority Data

Jan. 14, 1998 (JP) .......................................... 10-005224

(51) Int. Cl.[7] ................................................ H03K 9/04

(52) U.S. Cl. ........................ 375/239; 704/504; 704/223

(58) Field of Search ................................ 375/239, 238, 375/240, 253, 241, 242, 254, 265, 240.12, 240.14, 240.23, 240.1, 240.11; 704/207, 208, 212, 220, 214, 219, 500, 503, 504; 341/143, 185; 379/281, 286; 370/205, 212, 213, 215, 265; 714/699, 759, 775, 709

(56) References Cited

U.S. PATENT DOCUMENTS 5,488,704 A * 1/1996 Fujimoto .................... 704/219
5,673,364 A 9/1997 Bialik ....................... 395/2.92
5,696,874 A * 12/1997 Taguchi ...................... 704/219
5,724,480 A * 3/1998 Yamaura .................... 704/219
5,857,168 A * 1/1999 Ozawa ....................... 704/229
5,864,797 A * 1/1999 Fujimoto .................... 704/223
5,867,814 A * 2/1999 Yong .......................... 704/216
5,884,252 A * 3/1999 Ozawa ....................... 704/220
5,884,253 A * 3/1999 Kleijn ........................ 704/223
5,937,376 A * 8/1999 Minde ........................ 704/219
5,974,377 A * 10/1999 Navarro et al. ............. 704/220
RE36,721 E * 5/2000 Akamine et al. ........... 704/220

FOREIGN PATENT DOCUMENTS

JP 3-4300 1/1991
JP 6-75598 3/1994
JP 7-160298 6/1995
JP 8-511110 11/1996
JP 10-207496 8/1998

OTHER PUBLICATIONS

T. Nomura et al., "An MP–CELP Speech Coding Algorithm with Bit Rate Control, presented at "The proceedings SSD–5–3 of the Spring Meeting of the Electric Information Communication Society".

M. Schroeder et al., "Code Excited Linear Prediction: High Quality Speech at Very Low Bit Rates", IEEE Proc. Icass.–85, pp. 937–940.

S. Taumi et al., "Low–Delay CELP With Multi–Pulse VQ and Fast Search For GSM EFR"Proc. ICASSP 96, May, 1996, pp. 562–565.

J. Deller, Jr. et al., "Discrete–Time Processing Speech Signals", MacMillan Pub. 1993, pp. 290–329.

K. Paliwal et al., "Efficient Vector Quantization of LPC Parameters at 24 Bits–Frame" IEEE proceedings ICASSP–91, 1991, pp. 661–664.

* cited by examiner

*Primary Examiner*—Chi Pham
*Assistant Examiner*—Emmamuel Bayard
(74) *Attorney, Agent, or Firm*—Foley & Lardner

(57) ABSTRACT

A voice coding apparatus and a voice decoding apparatus are provided in order to improve the coding and decoding efficiency by eliminating useless coding levels. The apparatuses comprises an input terminal 24A for inputting the sub-frame length and for delivering it to the sub-frame dividing circuit 10 and an unit length calculating circuit 32A. The unit length calculating circuit calculates the unit length which determine a pulse interval from the sub-frame length supplied from the input terminal 24A and from a fundamental vector length supplied from the input terminal 26A, and delivers the obtained unit length to the table conversion circuit. The table designing circuit 34A designs the pulse position table based on the number of pulses supplied by the input terminal 26A and the fundamental vector length supplied by the input terminal 26A and deliver the unit length to the table circuit 36A.

6 Claims, 6 Drawing Sheets

VOICE CODING APPARATUS, VOICE DECODING APPARATUS, AND VOICE CODING AND DECODING SYSTEM

BACKGROUND OF THE INVENTION

1. Field of the Invention

This invention relates to a voice coding apparatus and a voice decoding apparatus and a voice coding and decoding system, and particularly relates to a voice coding and decoding system capable of establishing a coding rate randomly according to a designated parameter.

This application is based on Patent Application No. Hei 10- 005224 filed in Japan, the content of which is incorporated herein by reference.

2. Background Art

Conventional apparatuses related to this type of voice coding and decoding are used to facilitate to the realization of coding and decoding systems capable of coping with a plurality of applications with varied coding routes by using a single algorithm. For example, a few apparatuses are reported in a paper entitled "A Bit Rate Controllable Voice Coding System MP-CELP" (The Proceedings SSD-5-3 of the Spring Meeting of the Electronic Information Communication Society) (Reference 1) and in the document entitled "Voice Coding Apparatus and Voice Decoding Apparatus" (Japanese Patent Application, First Publication Hei 9-012477 (Reference 2).

These conventional apparatuses are based on CELP (Code Exited Prediction Coding). The CELP system is described in "Code-Excited Linear Prediction: High quality Speech at Very Low Bit Rates (IEEE Proc. ICASSP-85, pp. 937–940, 1985) (Reference 3).

The processing of the conventional apparatus is performed by the steps of: performing linear prediction analysis of the input signals for each frame, calculating the linear prediction factor (LP) representing the spectral envelope characteristics, calculating the drive signal by driving the LP synthetic filter corresponding to the spectral envelope characteristic, and executing coding. The coding of the drive signals is carried out for each subframe which is obtained by further dividing the frame.

Here, the drive signal is composed of a periodic component representing the pitch period of the input signal, a remaining residual component, and their gains. The periodic component representing the pitch period of the input signal is expressed by the adaptive code vector stored in a code book which holds the past drive signals, called an adaptive code book, and the remaining component is expressed as the multi-pulse signals composed of a plurality of pulses.

Furthermore, in the decoding processing of the conventional apparatus, a synthetic voice signal is obtained by inputting the drive signal obtained from the decoded pitch period component and remaining component into the synthetic filter constructed by the decoded LP factors. The positions where each pulse of the multi-pulse signal can exist are restricted in the range shown in a pulse position table, which is called the tracks established in the sub-frames for each pulse. This restriction serves to reduce the number of transmission routes required for coding the pulse position.

A report which describes multi-pulse signals was authored by S. Tamai et al., entitled "Low-Delay CELP with Multi-Pulse VQ and Fast Search for GSM EFR, in ICASSP 96, pp.562–565, May 1996 (Reference 4). The use of multi-pulses makes it easy to switch the coding routing by only changing the number of pulses used for pulse signals. In the conventional apparatuses, it is possible to realize the voice coding and decoding system which is operated at a designated coding route by changing the route setting parameters such as the number of pulses used for the multi-pulses, the length of the frame, or the length of the sub-frame.

Hereinafter, only the length of the sub-frame and the number of pulses will be noted as the route establishing parameter. Thus, the explanation of the apparatus will be executed under the presumption that the other parameters are fixed.

A construction of the conventional voice coding and decoding apparatus will be described hereinafter with reference to FIGS. 5 and 6. FIG. 5 shows a block-diagram showing the structure of a conventional voice coding apparatus. An input terminal 2 is used for inputting a voice signal and delivering the signals to the frame dividing circuit 4 and the sub-frame dividing circuit 10. The frame dividing circuit 4 cuts the signal supplied from the input terminal 2 into a predetermined length, and delivers it to the LP analysis circuit 6. The LP analysis circuit 6 obtains the LP factor by analyzing the voice signal supplied from the frame dividing circuit 4. Furthermore, the LP factor is supplied to an LP factor quantizing circuit 8, a weighting circuit 12, and the weighting synthesis circuits 18, 40. The detailed explanation of the LP factor analysis is given in the book entitled "Discrete- Time Processing of Speech Signals" (J. R. Deller, MacMillan Pub. 1993)" (Reference 5).

The LP factor quantizing circuit 8 quantizes the LP signals supplied by the LP analysis circuit 6 and the thus obtained codes are delivered to a multiplexer circuit 44. Furthermore, the quantized LP factors are supplied to the weighting circuit 12 and the weighting synthesis circuits 18 and 40. A detailed explanation of the quantization is given in "Efficient Vector Quantization of LPC Parameters at 24 Bits IFrame (IEEE Proc. ICASSP-91, pp. 661–664, 1991" (Reference 6).

The input terminal 24A is used for inputting at the time of starting the coding or for inputting the length of each sub-frame. The sub-frame dividing circuit 10 cuts the voice signal delivered from the input terminal 2 into a length of the sub-frame delivered from the input terminal 24*a*, and supplies it to the weighting circuit 12. The weighting circuits 12 performs filtering of the voice signal supplied from the LP analysis circuits 6 by the use of an audition weighting filter constructed by the LP factors supplied by the LP analysis circuit 6. The thus filtered weighted voice signals are delivered to circuit 14.

The audition weighting filter is described in the reference 3. The adaptive code book 16A generates said adaptive code vectors corresponding to the pitch period sequentially delivered from the evaluation circuit 20, and the adoptive code vectors are delivered to the weighting synthesis circuit 18. The weighting synthesis circuits 18 execute filtering of adaptive code vectors supplied from the adaptive code book circuit 16A by use of the audition weighting synthesis filter composed of LP factors supplied by the LP analysis circuit 6 and the quantized LP factors supplied by the LP factor quantization circuit 8. The thus obtained weighted synthesized signal is delivered to the difference circuit 14.

The difference circuit 14 calculates the difference between the weighted voice signal supplied by the weighting circuit 12 and the weighted synthesized signal supplied by the weighting synthesizing circuit 18, and delivers the difference signal to the evaluation circuit 20. The evaluation circuit 20 delivers a pitch period within a predetermined range to the adaptive code book sequentially, and sequentially calculates the sum of squares of the difference signals supplied from the difference circuit 14. The code, which corresponds to the pitch period where the sequentially obtained sum of squares becomes a minimum, is delivered to the multiplexer circuit 44. In addition, the difference signal corresponding to that pitch period is delivered to the difference circuit 22.

The input terminal 28 is used for inputting the number of pulses at the time of starting the coding or at each sub-frame, and delivers it to a table designing circuit 34A. The table designing circuit 34A designs the pulse position table by use of the sub-frame length supplied from the input terminal 24A and the number of pulses delivered by the input terminal 28A, and the table is supplied to the table circuit 36A. The pulse position table is used to make the code correspond with the pulse position. An example will be explained for a case of designing a table when the number of pulses is 5. When the length of the sub-frame is 40, each pulse position is set as follows.

The first pulse: 0, 5, 10, 15, 20, 25, 30, 35

The second pulse: 1, 6, 11, 16, 21, 26, 31, 36

The third pulse: 2, 7, 12, 17, 22, 27, 32, 37

The fourth pulse: 3, 8, 13, 18, 23, 28, 33, 38

The fifth pulse: 4, 9, 14, 19, 24, 29, 34, 39

In this case, it is necessary to ensure 3 bits for expressing the position of each pulse, 15 bits are necessary in total. Alternatively, if the pulse amplitude is either −1 or +1, one bit and 5 bits in total are required to represent the amplitude of the pulses. Therefore, 20 bits are necessary to represent the position and the amplitude of pulses in this case. When the length of the sub-frame is 35, the positions of each pulse are as follows.

The first pulse: 0, 5, 10, 15, 20, 25, 30

The second pulse: 1, 6, 11, 16, 21, 26, 31

The third pulse: 2, 7, 12, 17, 22, 27, 32

The fourth pulse: 3, 8, 13, 18, 23, 28, 33

The fifth pulse: 4, 9, 14, 19, 24, 29, 34

In this case, each pulse position is a 7 code level, and 3 bits are necessary for coding each pulse. Therefore, 20 bits are necessary for representing the positions and the amplitude of pulses.

The table circuit 36A delivers the positions and the amplitudes of pulses corresponding to codes sequentially delivered from the evaluation circuit 42 to the pulse voice source generation circuit 38A, according to the table supplied by the table designing circuit 34A. The pulse voice source generation circuit 38A generates multi-pulse signals according to the positions and the amplitudes of pulses delivered from the table circuits 36A, and delivers them to the weighting synthesis circuit 40. The weighting synthesis circuit 40 executes filtering of the multi-pulse signals delivered from the pulse voice source generation circuit 38A by use of the audition weighting synthesis filter constructed by the LP factor supplied from the LP analysis circuit 6 and the quantized LP factor supplied by the LP factor quantization circuit 8. The filtered weighting synthesized signal is delivered to the difference circuit 22.

The difference circuit 22 calculates the difference between the signal supplied from the evaluation circuit 20 and the synthesized signal supplied from the synthesized circuit 40, and delivers the result to the evaluation circuit 42. The evaluation circuit 42 delivers the codes within a predetermined range to the table circuit 36A sequentially, and calculates the sum of squares of the difference signals delivered from the difference circuit 22.

The codes corresponding to the minimum of the sum of squares of the difference is delivered to the multiplexer circuit 44. The multipler circuit 44 generates a code-string by summarizing codes supplied from the LP factor quantization circuit 8 and the evaluation circuit 20, and the code string is delivered to the output terminal 46. The output terminal 46 outputs the code-train delivered from the multiplexer circuit 44.

FIG. 6 illustrates a block-diagram showing an example of the structure of the conventional voice decoding apparatus. The input terminal 50 delivers the code string to the demultiplexer circuit 52. The demultiplexer circuit 52 separates the code strings from the input terminals and the separated codes of the quantized LP factor are supplied to the LP factor decoding circuit 54 and the code representing the pitch period is delivered to the pitch period decoding circuit 54 and the multi-pulse codes are delivered to the table circuit 36B.

The LP factor decoding circuit 54 decodes the quantized LP factors by the use of code supplied by the demultiplexer circuit 52 and the decoded factors are delivered to the synthetic filter 58. The pitch period decoding circuit 15 decodes the pitch period by use of the code delivered from the demultiplexer 52, and the decoded pitch period is delivered to the adaptive code book circuit 16B. The adaptive code book circuit 16B generates the adaptive code vector corresponding to the pitch period delivered by the pitch period decoding circuit 15 and the adoptive code vector is delivered to the adding circuit 56. The input terminal 24B executes inputting the length of the sub-frame and deliver to the table designing circuit 34B at the time of starting the decoding or at each sub-frame.

The input terminal 28B inputs the number of sub-frames and delivers the number of pulses to the table designing circuit 34B, when starting the coding or at each sub-frame. The table designing circuit 34B designs the pulse position table based on the length of the sub-frame delivered from the input terminal 24B and the number of pulses delivered from the input terminal 28B, and the obtained table is delivered to the table circuit 36B. The table circuit 36B supplies the position and the amplitude of the pulse which corresponds to the code delivered from the demultiplexer in the table supplied by the table designing circuit 34B to the pulse voice source generation circuit 38B.

The pulse voice source generation circuit 38B generates multi-pulse signals by use of the position and amplitude of the pulses supplied from the table circuit 16B and the signal is delivered to the adding circuit 56. The adding circuit 56 adds the adaptive code vector delivered from the adaptive code circuit 16B with the voice source signal supplied from the pulse voice source generation circuit 38B and the added signal is delivered to the synthesis circuit 58. The synthesis circuit 58 executes filtering of the added signal from the adding circuit 38B by the use of the filter constructed by the quantized LP factor supplied from the LP factor decoding circuit 56, and obtaining the synthesized voice signals. The synthesized voice signals are delivered to the output terminals 60. The output terminal 60 outputs the voice signals from the voice synthesizing circuit 58.

The above problem of the conventional technology is due to difficulties in designing the pulse position table so as not to generate a non-effective coding level in designing the pulse position, when the length of the sub-frame is randomly designated. The reason is because the number of coding level is not always a power of two.

It is therefore an object of the present invention to provide a voice coding and decoding system which comprises a voice coding apparatus and a voice decoding apparatus as shown below.

The present invention provides a voice coding apparatus which expresses a drive signal of a voice signal by multi-pulse signals comprising a plurality of pulses, and said drive signal is determined such that the stress, calculated by a regenerative voice obtained by driving a linear prediction synthesis filter defined by a linear prediction factor of said voice signal with said driving signal and said voice signal, is minimized; and the apparatus comprises: a circuit for designing a first pulse position table from a designated fundamental vector length and a designated number of said pulses, a circuit for calculating a unit length for establishing a pulse interval from a designated sub-frame length and said fundamental vector length; and a circuit for generating a second pulse position table used for coding the pulse position by converting said first pulse position table using said unit length.

The present invention provides a voice decoding apparatus which expresses a drive signal of a voice signal by multi-pulse signals comprising a plurality of pulses, and said drive signal is determined such that the stress, which is calculated by a regenerative voice obtained by driving a linear prediction synthesis filter defined by a linear prediction factor of said voice signal with said driving signal and said voice signal, is minimized, and the voice decoding system comprises a circuit for designing a first pulse position table from a designated fundamental vector length and a designated number of said pulses, a circuit for calculating a unit length for establishing a pulse interval from a designated sub-frame length and said fundamental vector length, and a circuit for generating a second pulse position table used for coding the pulse position by converting said first pulse position table using said unit length.

The present invention also provides a voice coding apparatus in which a drive signal of a voice signal is expressed by multi-pulse signals comprising a plurality of pulses, and said drive signal is determined such that the stress, calculated by a regenerative voice obtained by driving a linear prediction synthesis filter defined by a linear prediction factor of said voice signal with said driving signal and said voice signal, is minimized, and the apparatus comprises: a circuit for designing a first pulse position table from a designated fundamental vector length and a designated number of said pulses, a circuit for calculating a unit length for establishing a pulse interval from a designated sub-frame length and said fundamental vector length; a circuit for generating a second pulse position table used for coding the pulse position by converting said first pulse position table using said unit length, and a circuit for generating multi-pulse signals which are synchronized in pitch using said pitch period and said second pulse position table.

The present invention also provides a voice decoding apparatus for calculating a playback voice by driving the linear prediction synthesis filter defined by the linear prediction factor of said voice signal, the voice decoding apparatus comprises, a circuit for designing a first pulse position table from a designated fundamental vector length and a designated number of said pulses, a circuit for calculating a unit length for establishing a pulse interval from a designated sub-frame length and said fundamental vector length, a circuit for generating a second pulse position table used for coding the pulse position by converting said first pulse position table using said unit length, and a circuit for generating multi-pulse signals which are synchronized in pitch using said pitch period and said second pulse position table.

The voice coding and decoding system comprising the voice coding apparatus and the voice decoding apparatus according to the present invention has the following actions. The present system defines the pulse position by a unit length which is established separately from the sample, and the pulse position table defined by the sample is transformed using this unit length. Thereby, the number of coding levels representing the pulse position can be always in n powers of two. Consequently, useless coding levels can be eliminated without depending on the length of the sub-frame. For example, the fundamental pulse position table can be defined as follows. The maximum value of the table is 40, and the maximum value is called the fundamental vector length Lb.

The first pulse: 0, 5, 10, 15, 20, 25, 30, 35

The second pulse: 1, 6, 11, 16, 21, 26, 31, 36

The third pulse: 2, 7, 12, 17, 22, 27, 32, 37

The fourth pulse: 3, 8, 13, 18, 23, 28, 33, 38

The fifth pulse: 4, 9, 14, 19, 24, 19, 34, 39

In the case when the sub-frame length is, for example, 35, it is possible to make the level number the same, that is, to raise eight pulses as in the case 40 sample sub-frames, as follows.

The first pulse: 0,5Δ, 10Δ, 15Δ, 20Δ, 25Δ, 30Δ, 35Δ

The second pulse:Δ, 6Δ, 11Δ, 16Δ, 21Δ, 26Δ, 31Δ, 36Δ

The third pulse: 2Δ, 7Δ, 12Δ, 17Δ, 22Δ, 27Δ, 32Δ, 37Δ

The fourth pulse: 3Δ, 8Δ, 13Δ, 18Δ, 23Δ, 28Δ, 33Δ, 38Δ

The fifth pulse: 4Δ, 9Δ, 14Δ, 19Δ, 24Δ, 19Δ, 34Δ, 39Δ

Here, the unit length is expressed by equation (1)

$$\Delta=(Ls-1)/(Lb-1)=34/39 \quad (1)$$

By inserting the value obtained by the equation (1) in the above matrix, the following is obtained after rounding off.

The first pulse: 0, 4, 8, 13, 17, 21, 26, 30

The second pulse: 0, 5, 9, 13, 18, 22, 37, 31

The third pulse: 1, 6, 10, 14, 19, 23, 27, 32

The fourth pulse: 2, 6, 11, 15, 20, 24, 28, 33

The fifth pulse: 3, 7, 12, 16, 20, 25, 29, 34

When assuming the sub-frame length is 45, the pulse position table is obtained by setting Δ=44/39.

DETAILED DESCRIPTION OF PREFERRED EMBODIMENTS

Preferred embodiments of the present invention will be described hereinafter, with reference to the attached drawings.

Figure 1:
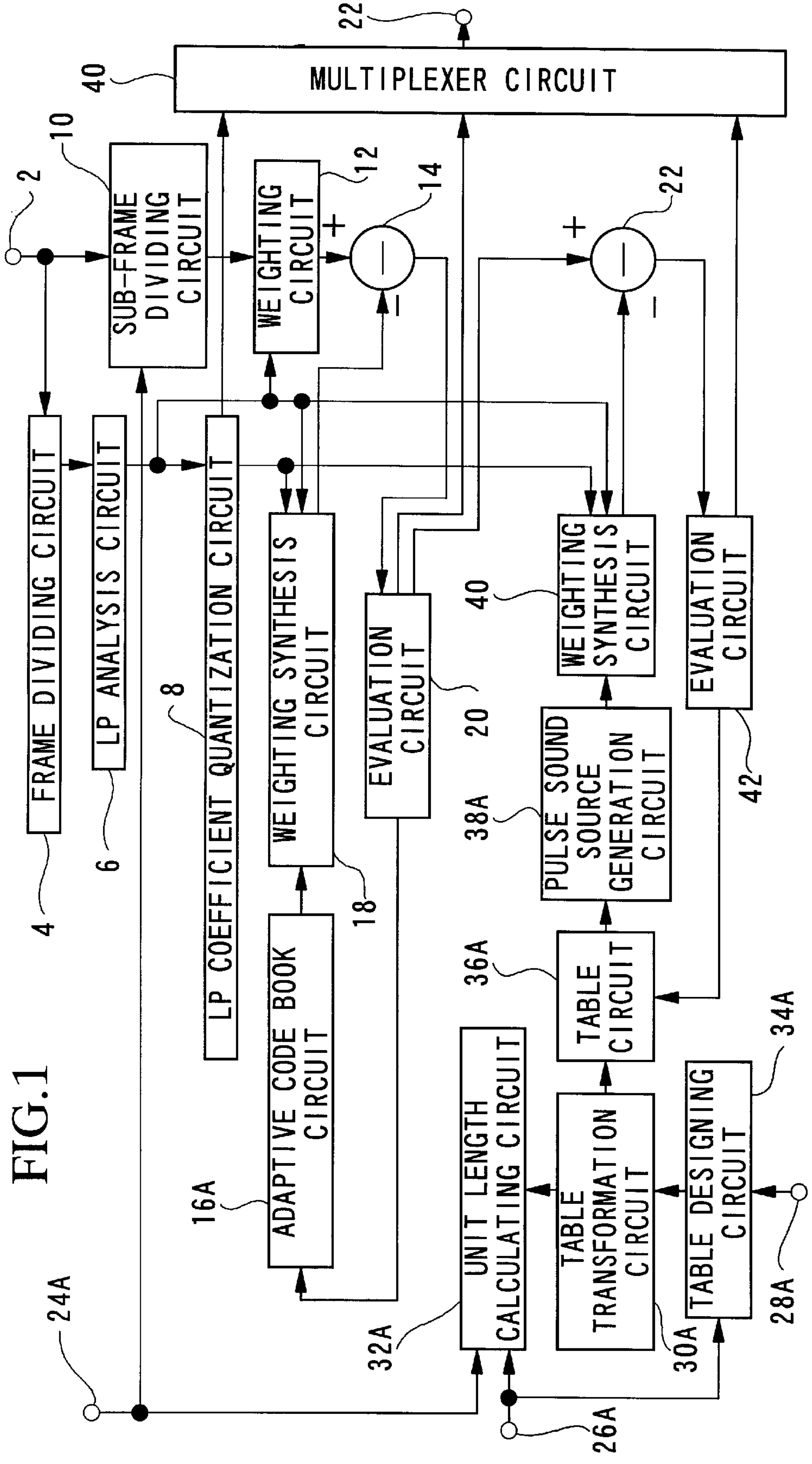
FIG. 1 is a block-diagram showing the structure of a voice coding apparatus according to one embodiment of the present invention.
Figure 2:
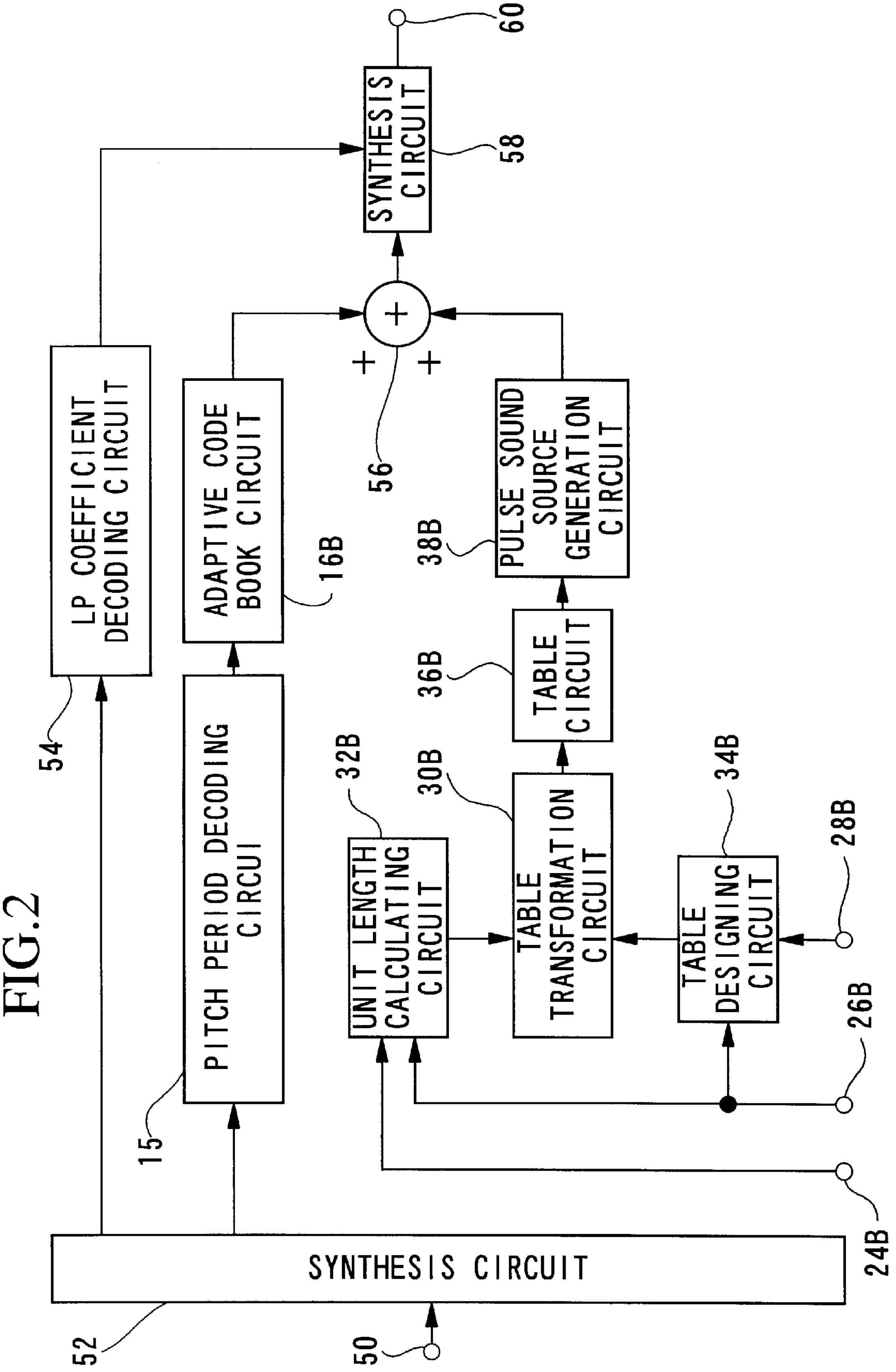
FIG. 2 is a block-diagram showing the structure of a voice decoding apparatus according to one embodiment of the present invention.
Figure 5:
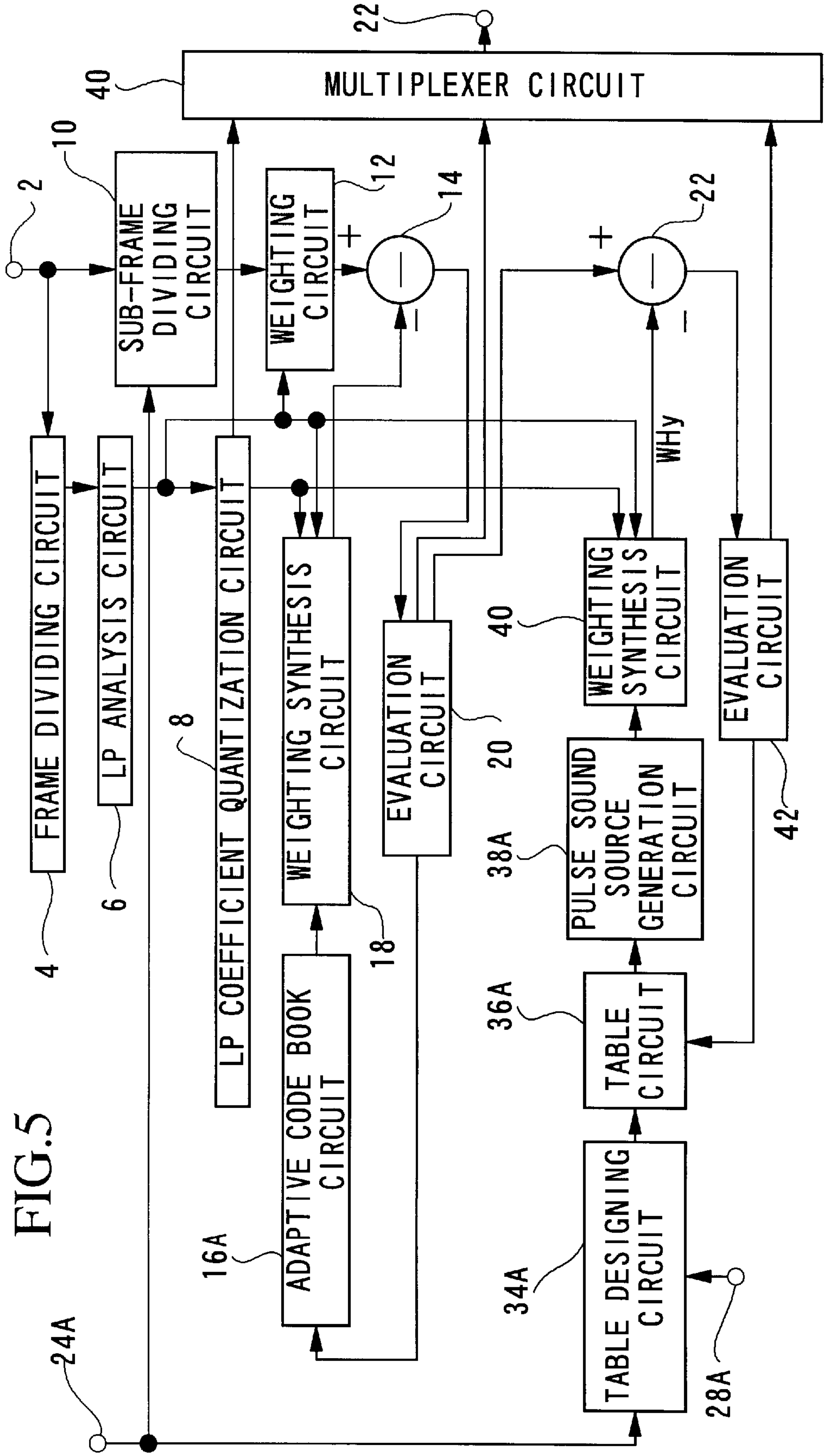
FIG. 5 is a block-diagram showing the structure of a conventional voice coding apparatus.
Figure 6:
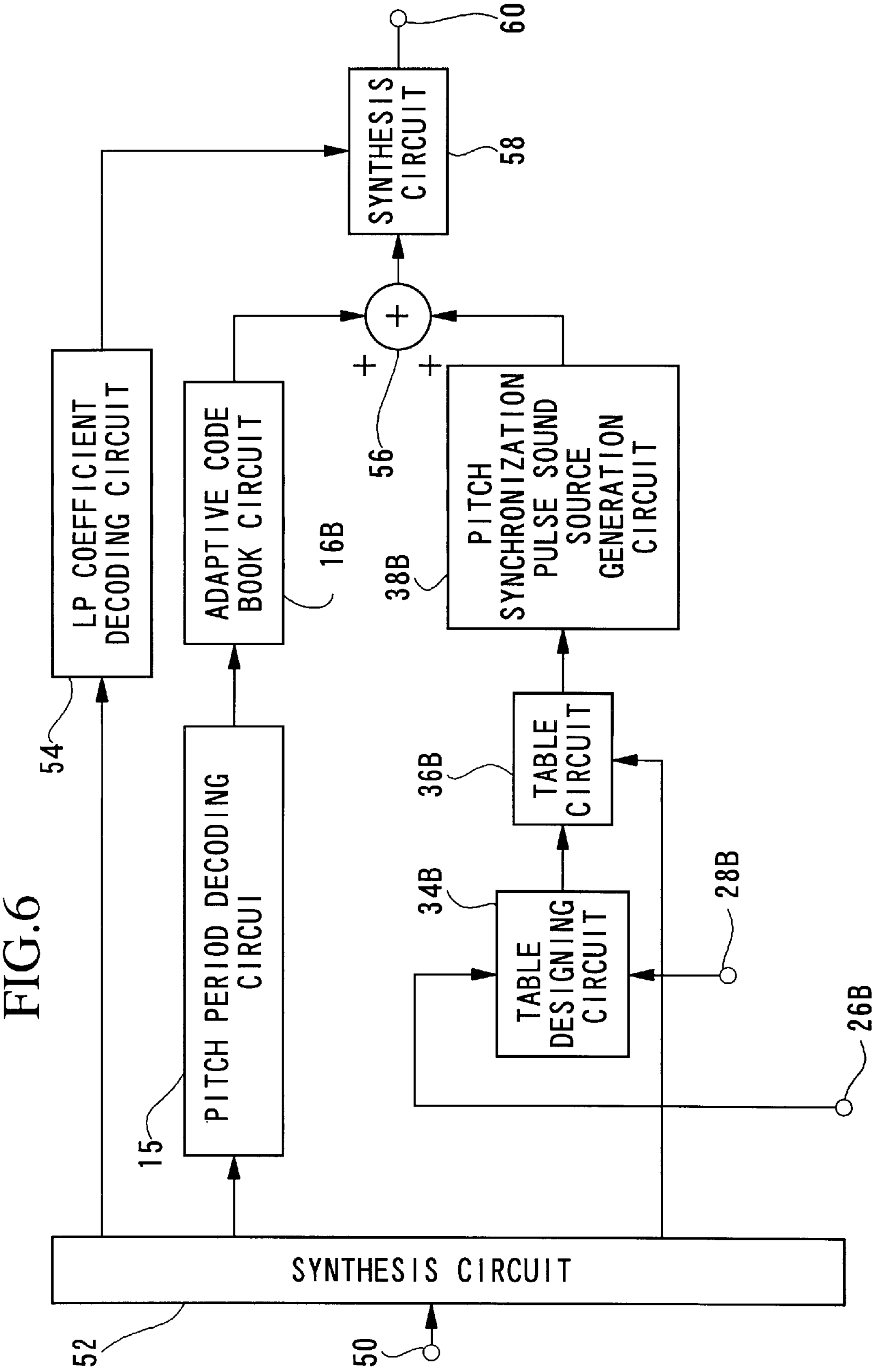
FIG. 6 is a block-diagram showing the structure of a conventional voice decoding apparatus.

FIGS. 1 and 2 show a voice coding apparatus and a voice decoding apparatus according to one embodiment of the present invention. The same numerals are used to designate the same components in the systems shown in FIGS. 5 and 6. Many components are the same as those used in the conventional voice coding and decoding apparatuses so that the circuits and portions in which the signal delivery are different from the conventional systems will be described.

In FIG. 1, the input terminal 24A executes inputting of the length of a sub-frame and the length of the sub-frame is delivered to a sub-frame dividing circuit 10 and a unit length calculating circuit 32A. The inputting terminal 26A inputs the fundamental vector length and delivers the length to the unit length calculating circuit 32A and a table designing circuit 34A. The unit length calculating circuit 32A calculates the unit length in the equation (1) which determines a pulse interval from the sub-frame length supplied from the input terminal 24A and the fundamental vector length supplied from the input terminal 26A, and the obtained unit length is delivered to a table conversion circuit 30A. The table designing circuit designs a pulse position table based on the number of pulses supplied by the input terminal 28A and the fundamental vector length supplied by the input terminal 30A and delivers the table to a table circuit 36A.

In FIG. 2, the input terminal 24B inputs the length of the sub-frame and delivers the length to the unit length calculating circuit 32B. The unit length calculating circuit 32B calculates the unit length which determines the pulse interval from the length of the sub-frame supplied by the input terminal 24B and the fundamental vector length supplied from the input terminal 26B and delivers the unit length to the table conversion circuit 30B. The table designing circuit 34B designs the pulse position table based on the pulse number supplied from the input terminal 28B and the fundamental vector length supplied from the input terminal 26B and delivers the obtained table to the table circuit 36B.

Figure 3:
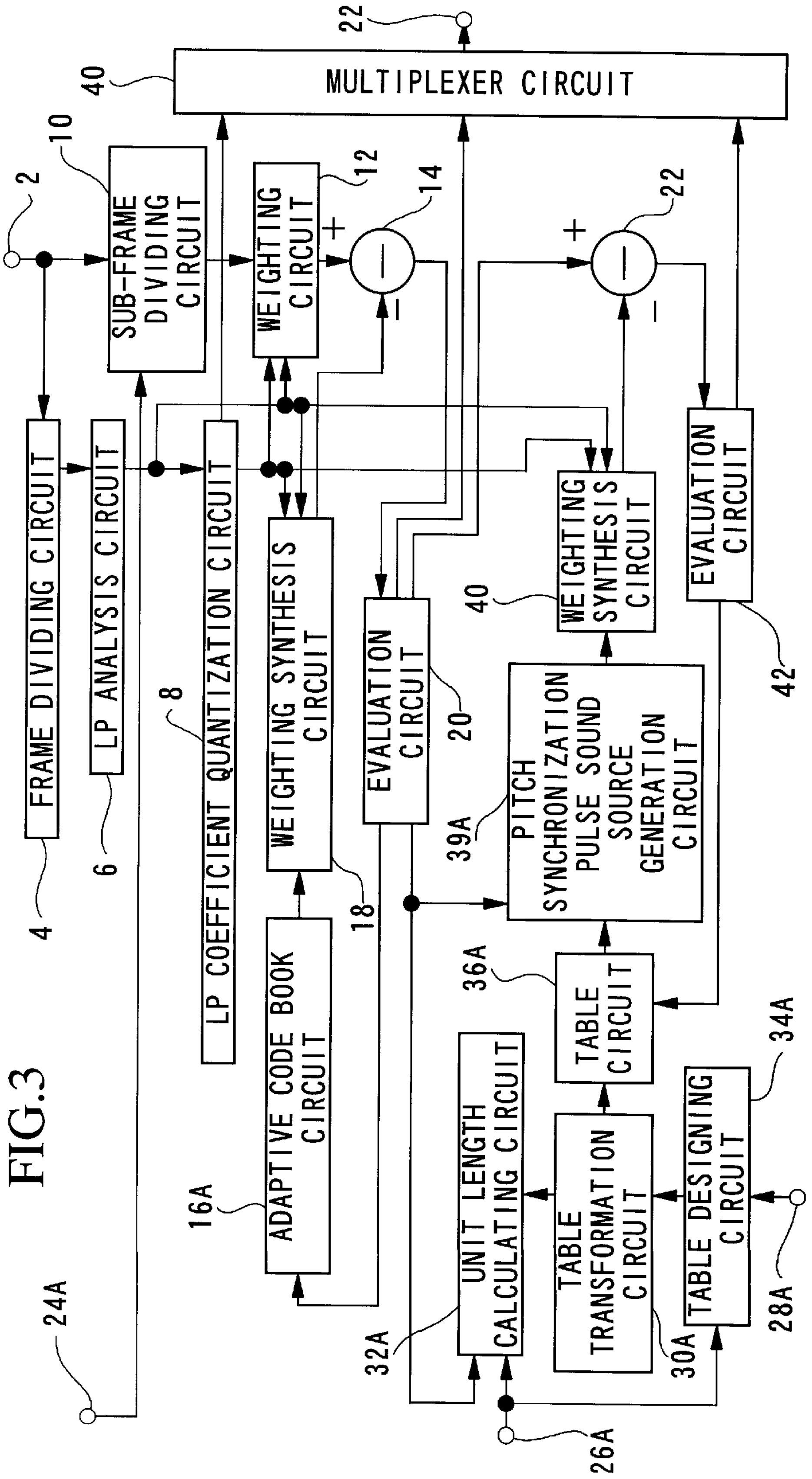
FIG. 3 is a block-diagram showing the structure of a voice coding apparatus according to another embodiment of the present invention.
Figure 4:
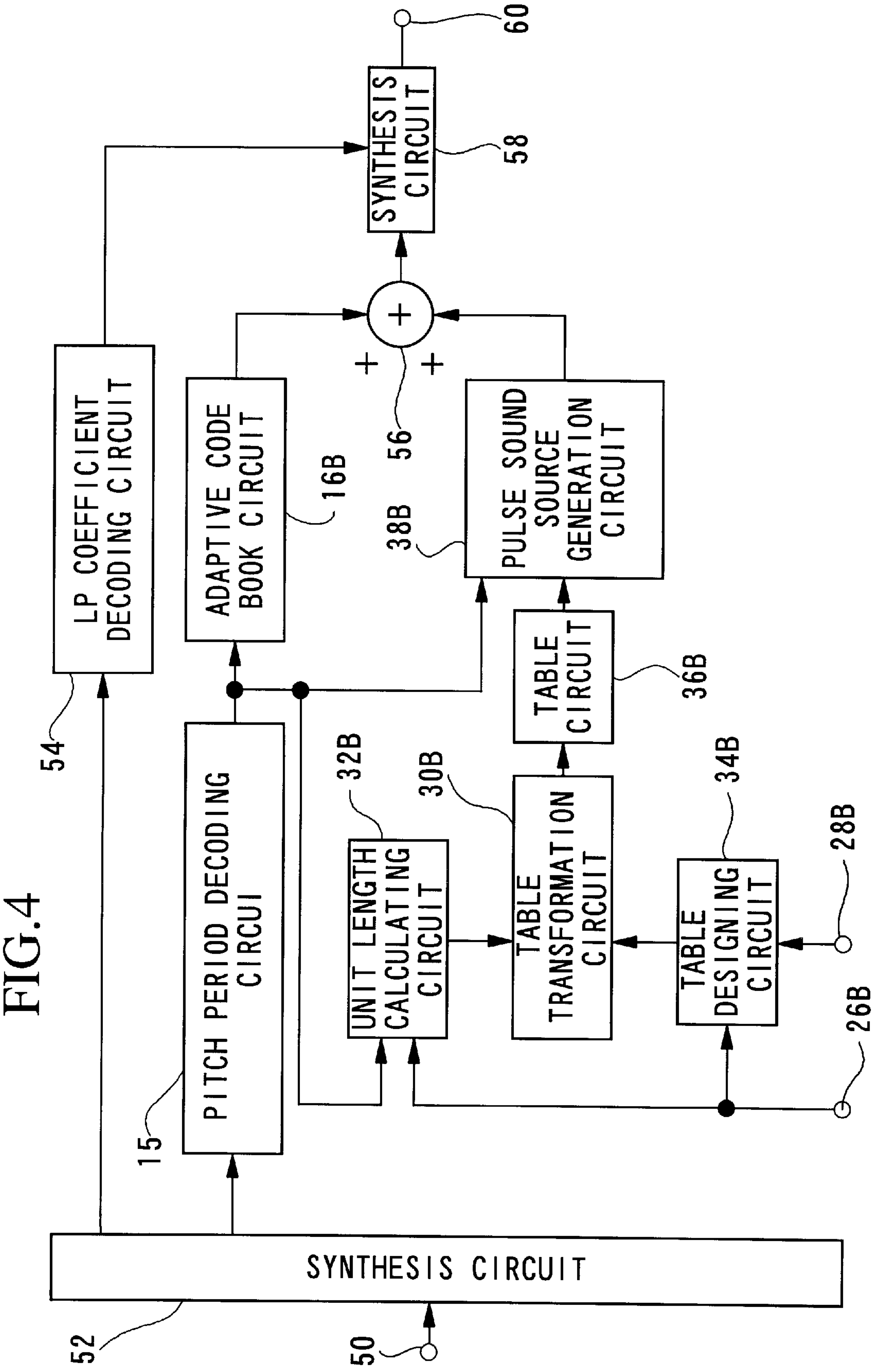
FIG. 4 is a block-diagram showing the structure of a voice decoding apparatus according to another embodiment of the present invention.

FIGS. 3 and 4 illustrate block diagrams of voice coding system and the voice decoding system according to another embodiments of the present invention. Many components are the same as those of the coding and decoding system shown in FIGS. 1 and 2, so that the specific circuits used in these systems and the portion which delivers the signals in a different manner will be described hereinafter.

The conventional systems shown in FIGS. 1 and 2 generate tables used in the sub-frame by conversion of the pulse position table according to the length of the sub-frame. However, in this embodiment, the table is generated according to the length of the pitch period, and the generated pulse is repeated by the pitch length in the sub-frame. The period length is generally in a range of around 20 to 140.

As shown in FIG. 3, the evaluation circuit 20 delivers the pitch period in a predetermined range to the adaptive code book 16A in sequence, and calculates sequentially the sum of squares of the differences supplied by the difference circuit 14. The code corresponding to a pitch period which is the minimum of the calculated sum of squares of the differences is delivered to the multiplexer circuit 44. In addition, the pitch period is delivered to the unit length calculating circuit 32A and to the pitch synchronized pulse voice source generation circuit 39A. The difference signal at the pitch period is delivered to the difference circuit 22.

The unit length calculation circuit 32A calculates the unit length to define the sub-frame length based on the sub-frame length supplied from the evaluation circuit 20 and the fundamental vector length supplied by the input terminal 26A, and delivers the unit length to the table conversion circuit 30A. The pitch synchronized pulse voice source generation circuit 39A generates the multi-pulse signal by use of the position and amplitude of the pulse supplied by the table circuit 36A and the pitch period supplied by the evaluation circuit 20. Each pulse is repeated at the pitch period.

For example, when the pitch is 20, and when the unit length is assumed to be $\Delta$=19/39, by following an example described hereinbefore, the table showing the position of pulses is expressed as follows:

The first pulse: 0, 2, 4, 7, 9, 12, 14, 17

The second pulse: 0, 2, 5, 7, 10, 12, 15, 17

The third pulse: 1, 3, 5, 8, 10, 13, 15,18

The fourth pulse: 1, 3, 6, 8, 11, 13,16, 18

The fifth pulse: 1, 4, 6, 9, 11, 14, 16, 19

When the length of the sub-frame is defined as 40, the first pulse, for example, will be located at the following position.

0, 2, 4, 7, 9, 12, 14, 17, 20, 22, 24, 27, 29, 32, 34, 37

Furthermore, the pitch synchronizing decoding circuit 15 decodes the pitch period by use of the codes supplied by the multiplexer circuit 52, and delivers the pitch period to the adaptive code book circuit 16B, the unit length calculating circuit 32B, and the pitch synchronizing pulse voice source generation circuit 39B. The pitch synchronizing voice source generation circuit 39B generates pulse signals by use of the position and amplitude of the pulse supplied by the table circuit 36B, and the pitch period supplied by the pitch period decoding circuit 15. In addition, the voice source signal is delivered to the adding circuit 56.

In turn, in the pulse position table generated by the table conversion circuit 30A and 30B, if the positions of two pulses on different tracks overlap, it is possible to relocate the position of one of the two pulses by shifting it by one sample length so as not to overlap, thereby one useless coding level can be eliminated.

In addition, if two pulses on different tracks are located at the same position, it is possible to reduce the number of pulses by limiting it to one pulse for that position. When the length of the sub-frame is short, the coding efficiency is sometimes degraded because excessive pulses are generated. Such degradation of the efficiency may be avoided by reduction of the number of pulses.

The effect of the present invention lies in the fact that, when designating a random length of the sub-frame, it is possible to design the pulse position table so as not to yield useless coding levels. The reason for this is that the number of coding levels is always a power of two.

What is claimed is:

1. A voice coding apparatus in which a drive signal of a voice signal is expressed by multi-pulse signals comprising a plurality of pulses, and said drive signal is determined such that the stress, calculated by a regenerative voice obtained by driving a linear prediction synthesis filter defined by a linear prediction factor of said voice signal with said driving signal and said voice signal, is minimized, the apparatus comprising:

a circuit for designing a first pulse position table from a designated fundamental vector length and a designated number of said pulses;

a circuit for calculating a unit length for establishing a pulse interval from a designated sub-frame length and said fundamental vector length; and a circuit for generating a second pulse position table used for coding the pulse position by converting said first pulse position table using said unit length.

2. A voice decoding apparatus in which a drive signal of a voice signal is expressed by multi-pulse signals comprising a plurality of pulses, and said drive signal is determined such that the stress, which is calculated by a regenerative voice obtained by driving a linear prediction synthesis filter defined by a linear prediction factor of said voice signal with said driving signal and said voice signal, is minimized, the apparatus comprising:

a circuit for designing a first pulse position table from a designated fundamental vector length and a designated number of said pulses;

a circuit for calculating a unit length for establishing a pulse interval from a designated sub-frame length and said fundamental vector length; and a circuit for generating a second pulse position table used for coding the pulse position by converting said first pulse position table using said unit length.

3. A voice coding and decoding system comprising a voice coding apparatus in which a drive signal of a voice signal is expressed by multi-pulse signals comprising a plurality of pulses, and said drive signal is determined such that the stress, calculated by a regenerative voice obtained by driving a linear prediction synthesis filter defined by a linear prediction factor of said voice signal with said driving signal and said voice signal, is minimized, and a voice decoding apparatus for generating a playback voice from code strings produced in said voice coding apparatus;

the voice coding apparatus comprises, a circuit for designing a first pulse position table from a designated fundamental vector length and a designated number of said pulses; a circuit for calculating a unit length for establishing a pulse interval from a designated sub-frame length and said fundamental vector length; and a circuit for generating a second pulse position table used for coding the pulse position by converting said first pulse position table using said unit length; and said voice decoding apparatus comprising: a circuit for designing a third pulse position table from a designated fundamental vector length and a designated number of said pulses; a circuit for calculating a unit length for establishing a pulse interval from a designated sub-frame length and said fundamental vector length; and a circuit for generating a fourth pulse position table used for decoding the pulse position by converting said third pulse position table using said unit length.

4. A voice coding apparatus in which a drive signal of a voice signal is expressed by multi-pulse signals comprising a plurality of pulses, and said drive signal is determined such that the stress, calculated by a regenerative voice obtained by driving a linear prediction synthesis filter defined by a linear prediction factor of said voice signal with said driving signal and said voice signal, is minimized, the apparatus comprising:

a circuit for designing a first pulse position table from a designated fundamental vector length and a designated number of said pulses;

a circuit for calculating a unit length for establishing a pulse interval from a designated sub-frame length and said fundamental vector length; a circuit for generating a second pulse position table used for coding the pulse position by converting said first pulse position table using said unit length; and a circuit for generating multi-pulse signals which are synchronized in pitch using a pitch period and said second pulse position table.

5. A voice decoding apparatus for calculating a playback voice by driving a linear prediction synthesis filter defined by a linear prediction factor of said voice signal, the voice decoding apparatus comprising:

a circuit for designing a first pulse position table from a designated fundamental vector length and a designated number of said pulses;

a circuit for calculating a unit length for establishing a pulse interval from a designated sub-frame length and said fundamental vector length;

a circuit for generating a second pulse position table used for coding the pulse position by converting said first pulse position table using said unit length; and a circuit for generating multi-pulse signals which are synchronized in pitch using a pitch period and said second pulse position table.

6. A voice coding and decoding system comprising a voice coding apparatus in which a drive signal of a voice signal is expressed by multi-pulse signals comprising a plurality of pulses, and said drive signal is determined such that the stress, calculated by a regenerative voice obtained by driving a linear prediction synthesis filter defined by a linear prediction factor of said voice signal with said driving signal and said voice signal, is minimized, and a voice decoding apparatus for generating a playback voice from the codestrings produced in said voice coding apparatus;

the voice coding apparatus comprises, a circuit for designing a first pulse position table from a designated fundamental vector length and a designated number of said pulses; a circuit for calculating a unit length for establishing a pulse interval from a designated sub-frame length and said fundamental vector length; and a circuit for generating a second pulse position table used for coding the pulse position by converting said first pulse position table using said unit length and a circuit for generating multi-pulse signals which are synchronized in pitch using said pitch period and said second pulse position table; and the voice decoding apparatus comprising, a circuit for designing a third pulse position table from a designated fundamental vector length and a designated number of said pulses; a circuit for calculating a unit length for establishing a pulse interval from a designated sub-frame length and said fundamental vector length; a circuit for generating a fourth pulse position table used for decoding the pulse position by converting said third pulse position table using said unit length, and a circuit for generating multi-pulse signals which are synchronized in pitch using said pitch period and said second pulse position table.

* * * * *